(12) United States Patent
Kishi et al.

(10) Patent No.: US 6,879,475 B2
(45) Date of Patent: Apr. 12, 2005

(54) MAGNETORESISTIVE EFFECT ELEMENT HAVING A FERROMAGNETIC TUNNELING JUNCTION, MAGNETIC MEMORY, AND MAGNETIC HEAD

(75) Inventors: Tatsuya Kishi, Kanagawa-ken (JP); Yoshiaki Saito, Kanagawa-ken (JP); Minoru Amano, Kanagawa-ken (JP); Shigeki Takahashi, Kanagawa-ken (JP); Katsuya Nishiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 10/233,505

(22) Filed: Sep. 4, 2002

(65) Prior Publication Data

US 2003/0062975 A1 Apr. 3, 2003

(30) Foreign Application Priority Data

Sep. 28, 2001 (JP) ........................................ 2001-298849

(51) Int. Cl.$^7$ ................................................ G11B 5/39
(52) U.S. Cl. ................................ 360/324.2; 360/324.12
(58) Field of Search ........................ 360/324.1, 324.11, 360/324.12, 324.2

(56) References Cited

U.S. PATENT DOCUMENTS

| | | | |
|---|---|---|---|
| 5,966,012 A | 10/1999 | Parkin | 324/252 |
| 5,966,323 A | 10/1999 | Chen et al. | 365/158 |
| 6,591,479 B2 * | 7/2003 | Nakazawa et al. | 29/603.08 |
| 6,633,461 B2 * | 10/2003 | Gill | 360/314 |
| 6,661,626 B2 * | 12/2003 | Gill | 360/324.2 |
| 2002/0036877 A1 * | 3/2002 | Sakakima et al. | 360/324.11 |

OTHER PUBLICATIONS

U.S. Appl. No. 09/662,117, filed Sep. 14, 2000, pending.
U.S. Appl. No. 10/102,944, filed Mar. 22, 2002, pending.

\* cited by examiner

*Primary Examiner*—Jefferson Evans
(74) *Attorney, Agent, or Firm*—Oblon, Spivak, McClelland, Maier & Neustadt, P.C.

(57) ABSTRACT

A magnetoresistive effect element of a tunnel junction type includes a magnetic multi-layered film (1), ferromagnetic film (3) and intervening insulating film (2) such that a current flows between the magnetic multi-layered film and the ferromagnetic film, tunneling through the insulating film. The magnetic multi-layered film includes a first ferromagnetic layer, second ferromagnetic layer and anti-ferromagnetic layer inserted between the first and second ferromagnetic layers.

31 Claims, 11 Drawing Sheets

MAGNETORESISTIVE EFFECT ELEMENT HAVING A FERROMAGNETIC TUNNELING JUNCTION, MAGNETIC MEMORY, AND MAGNETIC HEAD

CROSS-REFERENCE TO RELATED APPLICATIONS

This application is based upon and claims the benefit of priority from the prior Japanese Patent Application No. 2001-298849, filed on Sep. 28, 2001; the entire contents of which are incorporated herein by reference.

BACKGROUND OF THE INVENTION

This invention relates to a magnetoresistive effect element, magnetic memory and magnetic head, and more particularly to those having a ferromagnetic tunnel junction structure and capable of maintaining high sensitivity to an external magnetic field even when miniaturized in device size.

Magnetoresistive effect elements are under expectation toward practical use in a wide field of application including magnetic detector elements such as magnetic heads, magnetic memory devices, etc.

For example, there is a proposal of magnetic random access memory using a magnetic element exhibiting giant magnetoresistance effect as a solid magnetic storage device. Especially, magnetic memory using "ferromagnetic tunnel junction" is remarked as a magnetic element.

Ferromagnetic tunnel junction is mainly made of a three-layered film of first ferromagnetic layer/insulating film/second ferromagnetic layer, and a current flows, tunneling through the insulating film. In this case, the junction resistance value varies proportionally to the cosine of the relative angle between magnetization directions of the first and second ferromagnetic layers. Therefore, resistance value becomes minimum when the magnetization directions of the first and second ferromagnetic layers are parallel, and becomes maximum when they are anti-parallel. This is called tunneling magnetic resistance (TMR) effect. For example, in the literature, Appl. Phys. Lett., Vol. 77, p 283(2000), it is reported that changes of resistance value by TMR effect reaches as high as 49.7% at the room temperature.

In a magnetic memory including a ferromagnetic tunnel junction as a memory cell, magnetization of one of ferromagnetic layers is fixed as a "reference layer", and the other ferromagnetic layer is used as a "recording layer". In this cell, by assigning parallel and anti-parallel magnetic orientations of the reference layer and the recording layer to binary information "0", and "1", information can be stored.

For writing information, magnetization of the recording layer is reversed by a magnetic field generated by supplying a current to a write line provided for the cell, and by detecting a resistance change by TMR effect. A number of such memory elements are aligned to form a large-capacity memory device.

Its actual configuration is made up by placing a switching transistor for each cell and combining peripheral circuits similarly to DRAM (dynamic random access memory), for example. There is also a proposal of a system incorporating ferromagnetic tunnel junctions in combination with diodes at crossing positions of word lines and bit lines (U.S. Pat. No. 5,640,343 and U.S. Pat. No. 5,650,958).

For higher integration of magnetic memory elements using ferromagnetic tunnel junctions as memory cells, the size of each memory cell becomes smaller, and the size of the ferromagnetic element forming the cell inevitably becomes smaller. There is the same situation in magnetic recording systems when the recording density is enhanced and the recording bit size is decreased.

In general, as the ferromagnetic element becomes smaller, its coercive force increases. Since the intensity of the coercive force gives criteria for judging the magnitude of the switching magnetic field required for reversal of magnetization, its increase directly means an increase of the switching magnetic field. Therefore, upon writing bit information, a larger current must be supplied to the write line, and it invites undesirable results such as an increase of power consumption, shortening the wiring lifetime, etc. Therefore, it is an important issue for practical application of high-integrated magnetic memory to reduce the coercive force of the ferromagnetic element used as the memory cell of magnetic memory.

To overcome this problem, it has been proposed to use, as a "recording layer", a structure including multi-layered film of at least two ferromagnetic layers and a nonmagnetic layer interposed between them and including anti-ferromagnetic coupling between those ferromagnetic layers (Japanese Patent Laid-Open Publication No. H9-25162, Japanese Patent Application No. H11-263741 and U.S. Pat. No. 5,953,248).

In this case, two ferromagnetic layers included in the "recording layer" are different in magnetic moment and thickness, and their magnetic orientations are opposite under anti-ferromagnetic coupling. Therefore, they effectively cancel each other's magnetization, and the entirety of the recording layer can be regarded equivalent to a ferromagnetic element having small magnetization in the easy axis direction. If a magnetic field is applied in the opposite direction from orientation of the small magnetization in the easy axis direction the recording layer has, magnetization of each ferromagnetic layer reverses while holding the anti-ferromagnetic coupling. Therefore, because of the closed magnetic line of force, influences of the demagnetizing field are small, and the switching magnetic field of the recording layer is determined by the coercive force of each ferromagnetic layer. As a result, even a small switching magnetic field enables magnetic reversal.

In case that no layer-to-layer coupling exists between the magnetic layers (J=0), there is an interaction by magnetostatic coupling by the leak magnetic field from the magnetic layers. In this case, however, it is known that the switching magnetic field decreases similarly to a case where such coupling exists (24th Japan Applied Magnetics Academy Scientific Lecture 12aB-3, 12aB-7, 24th Japan Applied Magnetics Academy Scientific Lecture Summary p.26, 27).

However, in case that only magnetostatic coupling exists without no layer-to-layer coupling between magnetic layers, the magnetic structure made by the above-explained magnetization is unstable. Additionally, the squareness in the hysteresis curve or the magnetoresistance curve is small, and it is difficult to obtain a large magnetoresistance ratio. Therefore, it is not preferable for use as a magnetoresistive.

As explained above, reducing the switching magnetic field necessary for magnetic reversal of the "recording layer" is an indispensable factor for realization of a high-density magnetic recording system or magnetic memory, and it has been proposed to use a multi-layered film including anti-ferromagnetic coupling through a nonmagnetic metal layer.

However, as already recognized, in a minute ferromagnetic element in a minute magnetoresistive effect element as used in a high-density magnetic recording system or high-integrated magnetic memory, when the width of its shorter axis is miniaturized to the level of several microns through sub microns, a magnetic structure different from a central portion of the magnetic element is generated in perimeter portions of the magnetized region due to influences of an "demagnetizing field". Such a magnetic structure in perimeters is called "edge domain" (see, for example, J. App. Phys., 81, p.5471(1977)).

FIGS. 18A and 18B are schematic diagrams showing magnetic structures having such edge domains, respectively. In any of the magnetic structures shown in FIGS. 18A and 18B, magnetization M1 is generated in a direction in accordance with the magnetic anisotropy in a central portion of the magnetized region. In opposite end portions, however, magnetizations M2 through M5 are generated in directions different from that of the central portion. In this explanation, the domain structure shown in FIG. 18A is called "S-type structure", and the domain structure shown in FIG. 18B is called "C-type structure".

In a minute magnetic element used in a high-density magnetic recording system or high-integrated magnetic memory, the edge domain generated in its end portions exert strong influences, and changes of the magnetic structure pattern upon magnetic reversal becomes complicate. As a result, the coercive force increases, and the switching magnetic field undesirably increases.

As a method for minimizing such complicate changes of the magnetic structure, there is a proposal to fix the edge domain (U.S. Pat. No. 5,748,524, Japanese Patent Laid-Open 2000-100153). This method can certainly control behaviors upon magnetic reversal, but cannot substantially reduce the switching magnetic field. Additionally, his method needs an additional structure for fixing the edge domain, and it is not suitable for higher-density applications.

SUMMARY OF THE INVENITON

In some embodiments of the invention, as the ferromagnetic layer used as a magnetically free layer or a recording layer of a megnetoresistive element of a ferromagnetic tunnel junction type, a multi-layered film including a ferromagnetic layer and an anti-ferromagnetic layer is used. Thus a magnetoresistive effect element is provided, in which the switching magnetic field is reduced by making interaction by exchange coupling (or magnetostatic coupling) between the antiferromagnetic layer and the ferromagnetic layer, which is adjacent to the anti-ferromagnetic layer or placed nearest thereto via a nonmagnetic metal layer (or dielectric layer).

Exemplary structures of this kind of magnetic multi-layered film are: ferromagnetic layer/anti-ferromagnetic layer/ferromagnetic layer; ferromagnetic layer/nonmagnetic metal layer/anti-ferromagnetic layer/nonmagnetic metal layer/ferromagnetic layer; and ferromagnetic layer/dielectric layer/anti-ferromagnetic layer/dielectric layer/ferromagnetic layer. In case of the structure of ferromagnetic layer/anti-ferromagnetic layer/ferromagnetic layer, a weak anti-ferromagnetic material is preferably used to control the magnitude of exchange coupling between the anti-ferromagnetic layer and the ferromagnetic layer.

In case of the structure of ferromagnetic layer/ nonmagnetic metal layer/anti-ferromagnetic layer/ nonmagnetic metal layer/ferromagnetic layer, exchange coupling can be controlled by adequately determining the material and thickness of the nonmagnetic metal layer placed between the anti-ferromagnetic layer and the ferromagnetic layer.

Similarly, in case of the structure of ferromagnetic layer/ dielectric layer/anti-ferromagnetic layer/dielectric layer/ ferromagnetic layer, exchange coupling can be controlled by adequately determining the material and thickness of the dielectric layer placed between the anti-ferromagnetic layer and the ferromagnetic layer.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Some embodiments of the invention will now be explained below with reference to the drawings.

Figure 1:
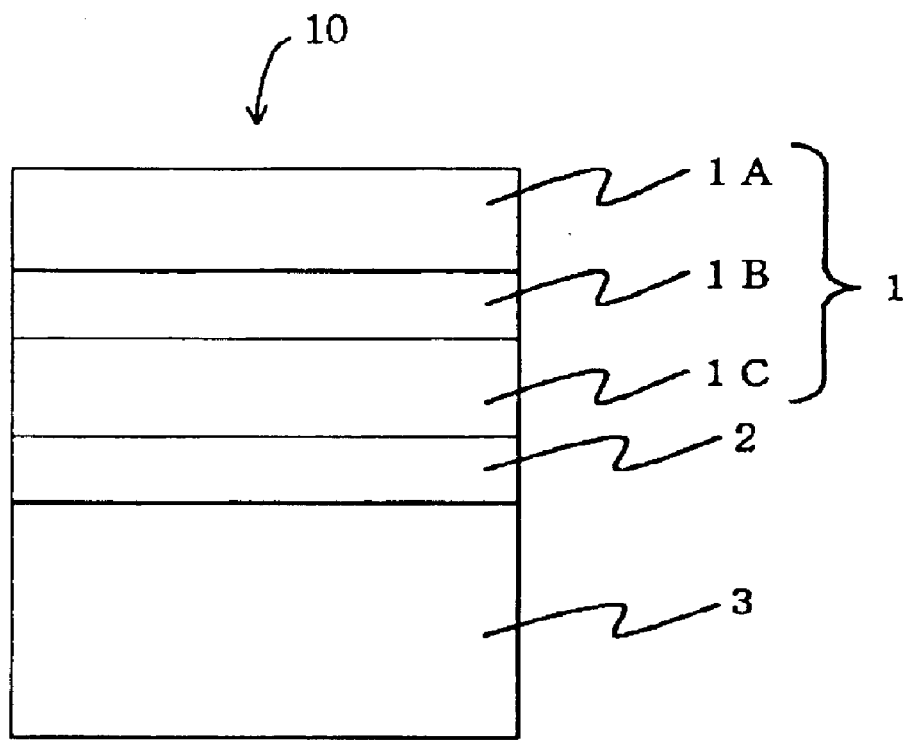
FIG. 1 is a schematic diagram illustrating a cross-sectional structure of the substantial part of a magnetoresistive effect element according to the first embodiment of the invention.

FIG. 1 is a schematic diagram illustrating a cross-sectional structure of the substantial part of a magnetoresistive effect element according to the first embodiment of the invention. The magnetoresistance element 10 shown here has a ferromagnetic tunnel junction structure interposing an insulating film 2 between a magnetic multi-layered film 1 and a ferromagnetic film 3. The magnetic multi-layered film 1 has a ferromagnetic property as a whole, and it corresponds to a simplex ferromagnetic film in a conventional ferromagnetic tunnel junction structure. With this magnetic multi-layered film 1, a current flows between the magnetic multi-layered film 1 and the ferromagnetic film 3, tunneling through the insulating film 2, and the junction contact value varies proportionally to the cosine of the relative angle of magnetization orientations of the magnetic multi-layered film 1 and the ferromagnetic film 3.

As explained later, in case of using the magnetoresistive effect element 10 as a magnetic detector element, for example, the magnetic multi-layered film 1 may be used as the "magnetically free layer", and the ferromagnetic film 3 may be used as the "magnetically pinned layer". When the element 10 is used as a magnetic memory element, the magnetic multi-layered film 1 may be used as the "recording layer", and the ferromagnetic film 3 as the "reference layer".

In the first specific example of the invention, the ferromagnetic multi-layered film 1 of the ferromagnetic tunnel junction element 10 is in form of a multi-layered structure of ferromagnetic layer 1A/anti-ferromagnetic layer 1B/ferromagnetic layer 1C. However, the multi-layered structure shown in FIG. 1 may be reversed in stacking order. That is, the magnetic multi-layered film 1 may underlie the insulating film 2 and the ferromagnetic film 3 may overlie the insulating film 3.

Figure 2:
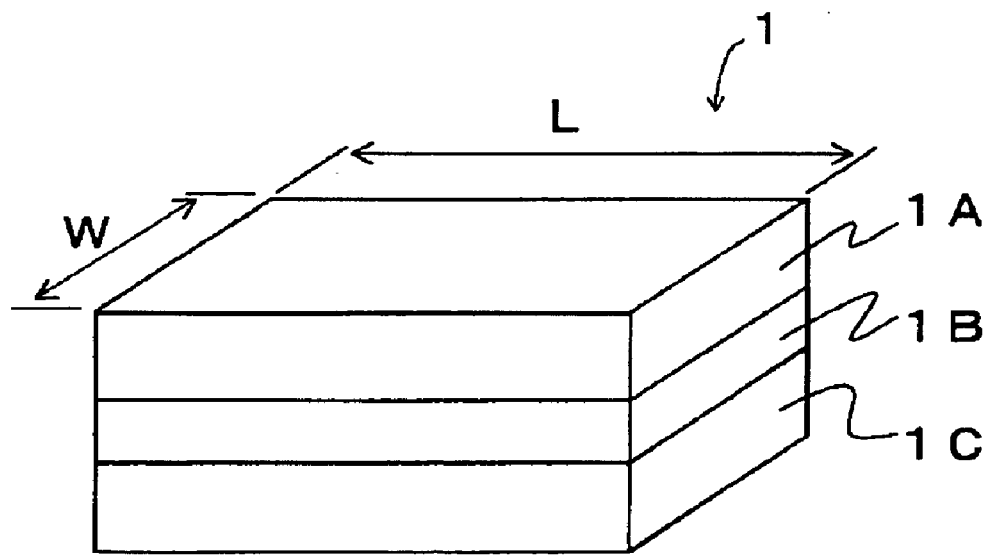
FIG. 2 is a schematic diagram of a multi-layered structure of a magnetic multi-layered film 1.

FIG. 2 is a schematic diagram of a multi-layered structure of the magnetic multi-layered film 1. The inventor closely examined magnetic properties of this kind of multi-layered structures, and got his own knowledge.

$Co_{90}Fe_{10}$ was used as the material of the ferromagnetic layers 1A, 1C, and IrMn was used as the intervening anti-ferromagnetic layer 1B. The ferromagnetic layers 1A, 1C were 2 nm thick and 3 nm thick, respectively, and the anti-ferromagnetic layer 1B was 1 nm thick. This multi-layered film was sized 0.1 μm in width L and 0.3 μm in length L, and had a rectangular shape having the aspect ratio of 1:3. Additionally, the ferromagnetic layers 1A, 1C were assumed to be in exchange coupling of the magnitude as large as 30 Oe (oersted).

Figure 3:
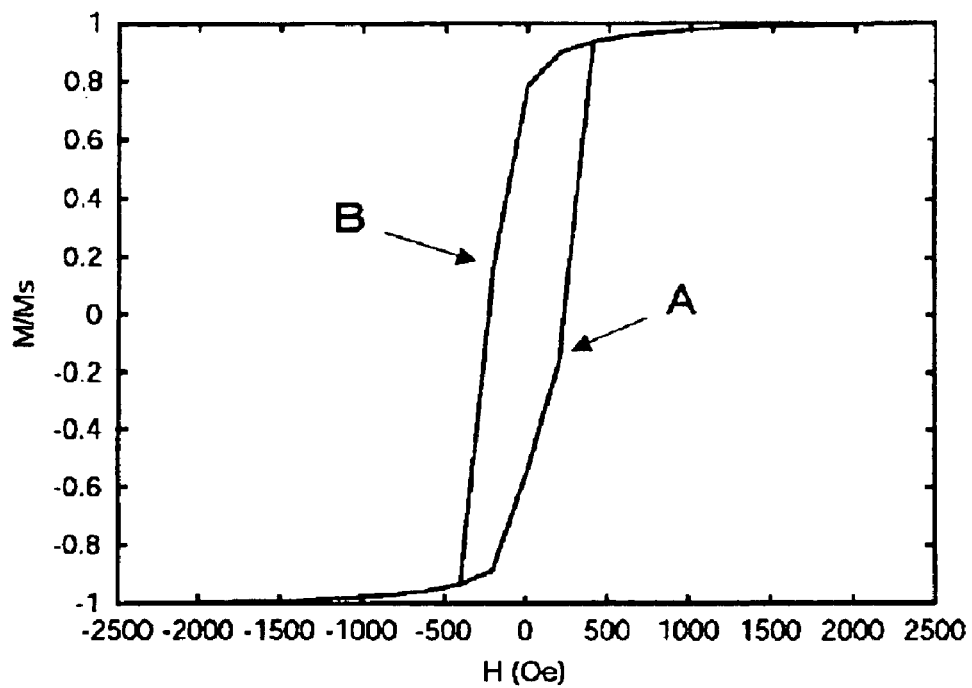
FIG. 3 is a graph diagram showing magnetic hysteresis of the magnetic multi-layered film 1 shown in FIG. 2.

FIG. 3 is a graph diagram showing magnetic hysteresis of the magnetic multi-layered film 1 shown in FIG. 2. In the graph, magnetic field intensity applied is put on the abscissa, and ratio of magnetization relative to the saturation magnetization Ms is put on the ordinate.

In FIG. 3, coercive force is defined as the intensity of the magnetic field corresponding to the width of the hysteresis curve. In the magnetic multi-layered film 1 shown in FIG. 2, interaction by exchange coupling of the anti-ferromagnetic layer 1B works to the ferromagnetic layers 1A, 1C. Therefore, the plus side and the minus side of the X-axis are different in coercive force. Thus these values of coercive force are herein called "right coercive force" (plus side) and "left coercive force" (minus side). In this specific example, exchange coupling is not so large. Therefore, almost no difference between right and left sides. The right coercive force is 229 Oe, and the left coercive force is 231 Oe.

Figure 4:
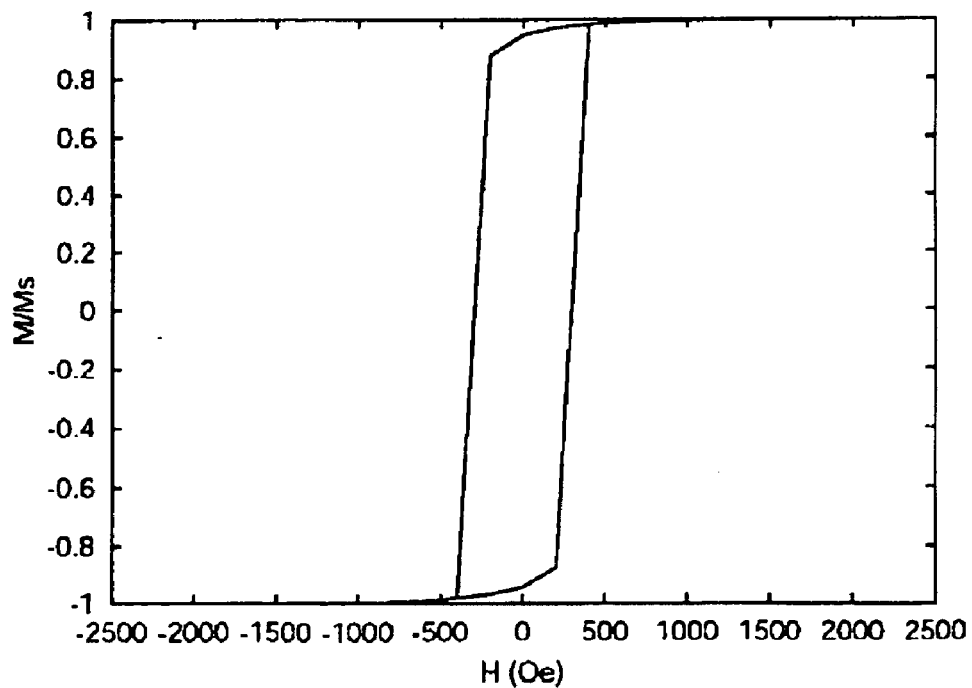
FIG. 4 is a graph diagram showing magnetic hysteresis of a simplex ferromagnetic layer taken as a comparative example.

FIG. 4 is a graph diagram showing magnetic hysteresis of a simplex ferromagnetic layer taken as a comparative example. That is, here is shown the magnetic property of a simplex ferromagnetic layer and not of a multi-layered structure interposing an anti-ferromagnetic layer as shown in FIG. 2.

In the hysteresis curve of FIG. 4, there is no shift as shown in the hysteresis curve of FIG. 3 (labeled A and B in FIG. 3). The right and left coercive forces are equally as high as 294 Oe, and it is higher than of FIG. 3. That is, it is appreciated that the coercive force of the magnetic multi-layered film 1 shown in FIGS. 1 and 2 is lower than that of the simplex ferromagnetic layer.

Additionally, the embodiment of the invention is effective also for improving thermal stability of the magnetoresistive effect element. For example, as parameter indicating durability of a magnetic recording medium against thermal turbulence, the following equation can be defined.

$$\alpha = (KuV)/(k_B T)$$

where Ku is the magnetic anisotropy parameter, V is the volume, $K_B$ is the Boltzmann constant, and T is the temperature.

In general, when the parameter α is in the range 60 through 80, the magnetic recording medium can be considered to be thermally stable. Since this parameter a depends upon the volume of the magnetic element, if the ferromagnetic layer becomes thicker, the value of α increases, and the thermal stability is enhanced. However, when the volume of the magnetic element increases, the coercive force also increases and makes information writing difficult. Therefore, a ferromagnetic layer having a small coercive force and excellent thermal stability is requested as the free layer.

The ferromagnetic multi-layered film 1 used in the embodiment of the invention is comprised of at least two ferromagnetic layers 1A, 1C, and the intervening anti-ferromagnetic layer 1B. Therefore, each of the ferromagnetic layers 1A, 1C can be thinned to decrease the coercive force. On the other hand, since the ferromagnetic layers 1A, 1C are coupled via the anti-ferromagnetic layer 1B, the volume of the magnetic element may be regarded to be the total of the ferromagnetic layers 1A, 1C, and the value of the parameter α is therefore doubled. That is, the embodiment of the invention can provide a free layer satisfying both a small coercive force and high thermal stability.

This effect of reducing the coercive force and improving the thermal stability is not limitative to the above-explained specific example. For instance, as the material of the ferromagnetic layers 1A, 1C, typical magnetic materials such as iron (Fe), cobalt (Co), nickel (Ni), their multi-layered structures and alloys are also usable similarly.

Magnetic amorphous alloys are also usable as the material of the ferromagnetic layers 1A, 1C. More specifically, boron (B)-family amorphous alloys such as FeB, CoB, CoNbB, CoFeB and NiFeB, phosphorus (P)-family amorphous alloys such as FeP and CoP, and zirconium (Zr)-family amorphous alloys such as FeZr, CoZr, NiZr and CoNbZr can be used.

Also, the material of the anti-ferromagnetic layer 1B can be selected from various kinds of anti-ferromagnetic materials including manganese-family antiferromagnetic materials such as platinum manganese (PtMn), iron manganese (FeMn), ruthenium manganese (RuMn), nickel manganese (NiMn) and palladium platinum manganese (PdPtMn). Especially, high-conductivity materials are preferable.

Thickness of the anti-ferromagnetic layer 1B is preferably adjusted to fall in the range not thinner than 0.1 nm and not exceeding 50 nm so that moderate exchange coupling is obtained and the coercive force can be decreased.

Figure 18A:
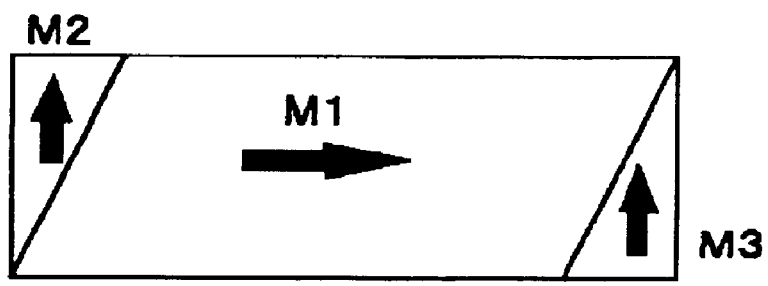
FIGS. 18A and 18B are schematic diagrams illustrating magnetic structures having edge domains.
Figure 18B:
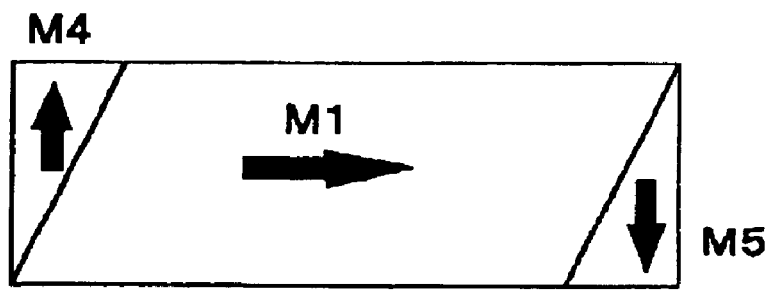

The device size can be determined appropriately, depending upon its intended way of use. When the width is smaller than 1 μm approximately, the coercive force is remarkably reduced as compared with the simplex ferromagnetic layer. In regard to the aspect ratio, in case the "edge domain" generates as explained with reference to FIGS. 18A and 18B, especially remarkable effect is obtained. For example, when the aspect ratio is 1:1.5 through 1:10, a large effect is obtained.

Further, as explained in detail in Japanese Patent Application No. 2001-076614 in the name of the same Inventor, if a magnetoresistive effect element is shaped to be wider in its end portions than in its central portion when viewed in its plan view, it contributes to stabilization of the "edge domain" in its end portions and thereby makes it possible to further reduce the switching magnetic field, i.e. the magnetic field for writing. In this case, the ideal plan-view shape of the magnetoresistive effect element is a shape enlarged in width toward the opposite end as a "bow tie". If the "bow tie" shape is elongated along one of diagonal lines to degrade the symmetry, then the switching magnetic field can be reduced further.

On the other hand, thickness of the ferromagnetic layers 1A, 1C is preferably not thicker than 10 nm and more preferably not thicker than 5 nm.

Intensity of exchange coupling via the anti-ferromagnetic layer 1B must be limited in a certain range such that the coercive force does not increase so much and the hysteresis does not shift so much from the origin.

Figure 5:
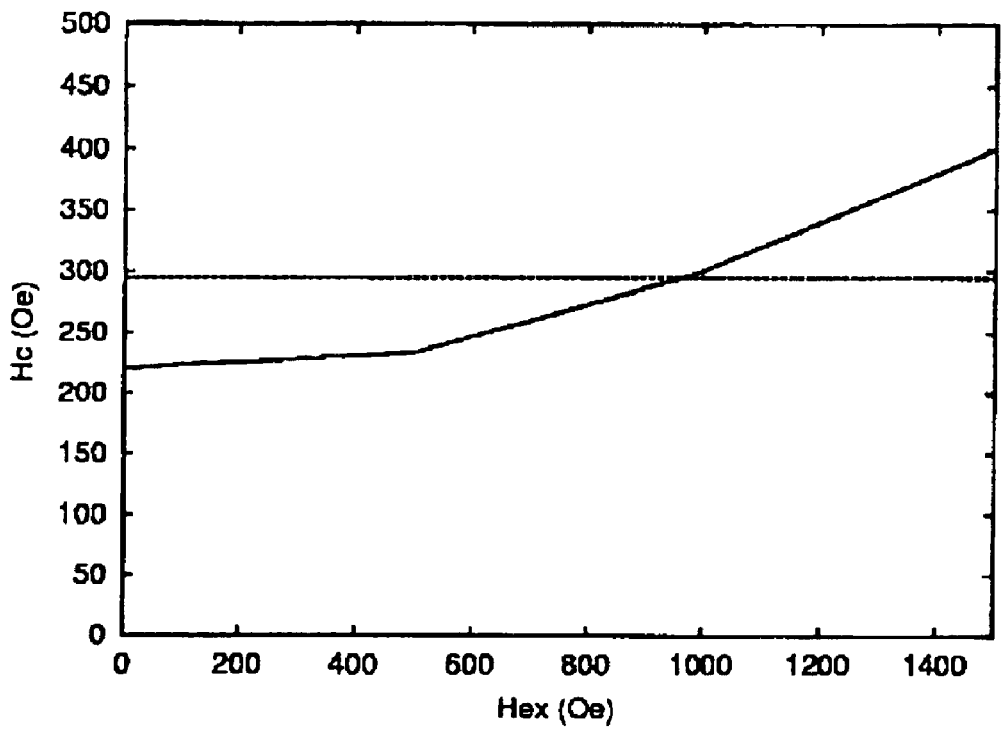
FIG. 5 is a graph diagram showing a relation between the exchange coupling intensity Hex and the coercive force Hc.

FIG. 5 is a graph diagram showing a relation between the exchange coupling intensity Hex and the coercive force Hc. In FIG. 5, the solid line is the graph of the magnetic multi-layered film 1 shown in FIG. 2 whereas the broken line is the graph of a simplex ferromagnetic layer taken as a comparative example.

It is appreciated from FIG. 5 that the coercive force Hc is constantly 300 Oe in case of the simplex ferromagnetic layer. In case of the magnetic multi-layered film according to the embodiment of the invention, the coercive force is minimum when the exchange coupling intensity Hex is nearly zero, and the coercive force Hc remains sufficiently small until Hex reaches approximately 300 Oe. When Hex further increases, the coercive force Hc increases. When Hex exceeds 1 kOe, the coercive force exhibits a larger value than that of the simplex layer (broken line).

Therefore, in order to reduce the reversal magnetization of the magnetic multi-layered film 1 in the magnetoresistive effect element, i.e. the switching magnetic field, intensity of the exchange coupling should be limited below 1 kOe, more preferably below 400 Oe, and more preferably 100 Oe.

Magnitude of the switching magnetic field of the magnetic multi-layered film 1 is smaller when two ferromagnetic layers 1A, 1B is equally 1.0 nm thick than when they are 2.0 nm thick and 3.0 nm thick, respectively. Therefore, the ferromagnetic layers 1A, 1B are preferably adjusted to be thin, and advantageously limited below 3 nm.

The Inventor made a review on the magnetic structure (domain pattern) made by magnetization in the ferromagnetic layers 1A, 1C as well.

Figure 6A:
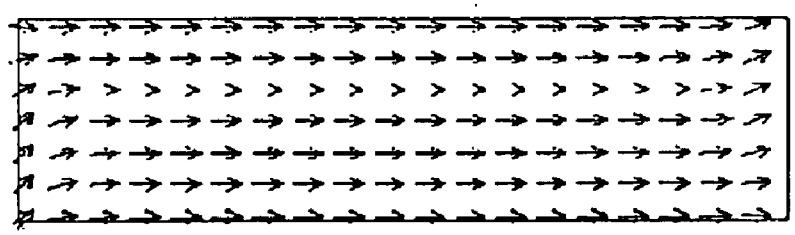
FIG. 6A is a schematic diagram showing a domain pattern appearing in ferromagnetic layers 1A, 1C under exchange coupling of the magnitude Hc as large as 30 Oe.

FIG. 6A is a schematic diagram showing a domain pattern appearing in ferromagnetic layers 1A, 1C under exchange coupling of the magnitude Hc as large as 30Oe.

Apparently from FIG. 6A, magnetization of the ferromagnetic layers 1A, 1C is oriented substantially in one direction as a whole, and the edge domains in the end portions do not occupy so large area.

Figure 6B:
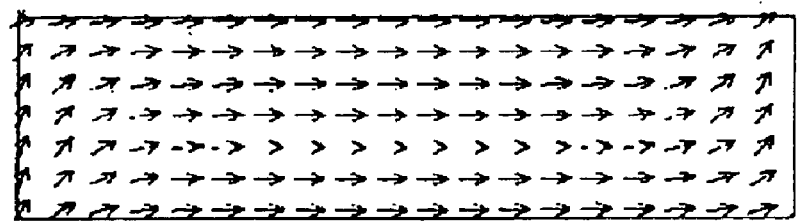
FIG. 6B is a schematic diagram showing a domain pattern in a simplex ferromagnetic layer as a comparative example.

FIG. 6B is a schematic diagram showing a domain pattern in a simplex ferromagnetic layer as a comparative example. In this case, magnetization different from that of the central portion appears in the end portions, and obvious "edge domains" are confirmed.

In general, since the TMR (tunneling magnetoresistance) effect degrades under the existence of edge domains, edge domains had better be small. The embodiment of the invention can sufficiently decrease the size of edge domains as compared with that of a simplex ferromagnetic layer.

That is, when the magnetoresistive effect element according to the embodiment is shaped to be wider in end portions than in the central portion, "edge domains" in the end portions can be stabilized, and it contributes to a more decrease of the switching magnetic field.

Next explained is the second specific example of the invention.

Figure 7:
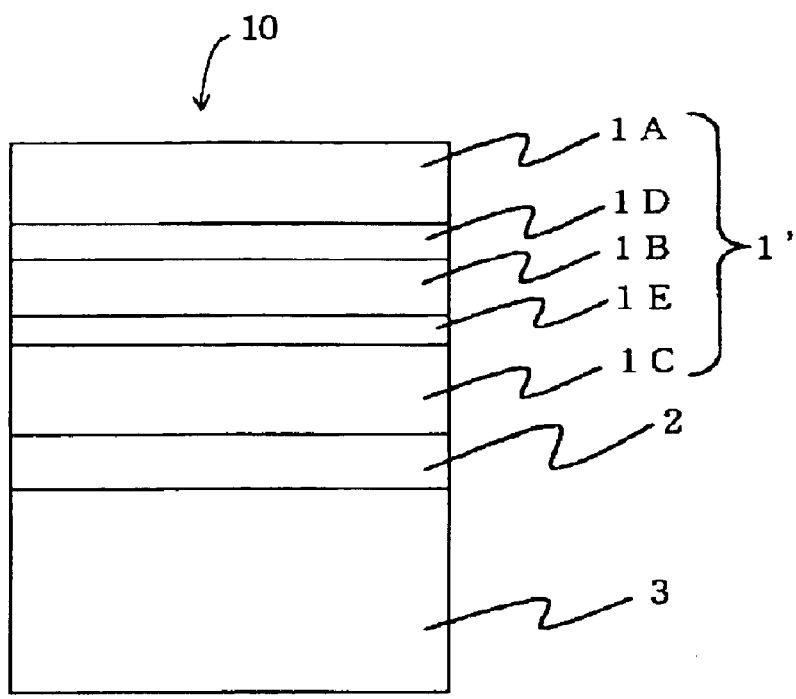
FIG. 7 is a schematic diagram showing a cross-sectional structure of the substantial part of a magnetoresistive effect element according to the second embodiment of the invention.

FIG. 7 is a schematic diagram showing a cross-sectional structure of the substantial part of a magnetoresistive effect element according to the second specific example of the invention.

Here again, the magnetoresistance element 10 has a ferromagnetic tunnel junction structure in which the insulating film 2 is inserted between the magnetic multi-layered film 1' and the ferromagnetic film 3. A current flows between the magnetic multi-layered film 1' and the ferromagnetic film 3, tunneling through the insulating film 2, and the junction resistance value varies proportionally to the cosine of the relative angle between magnetization directions of the magnetic multi-layered film 1' and the ferromagnetic film 3. As explained in conjunction with the first specific example, the magnetic multi-layered film 1' can be used as a "magnetically free layer" of a magnetic detector element or a "recording layer" of a magnetic memory.

The magnetic multi-layered film 1' in this specific example is different in configuration. That is, the magnetic multi-layered film 1' in this specific example includes non-magnetic metal layers 1D, 1E between the ferromagnetic layers 1A, 1C and the anti-ferromagnetic layer 1B, respectively.

The nonmagnetic metal layers 1D, 1E have the role of moderately relaxing magnetic coupling between the ferromagnetic layers 1A, 1C and the anti-ferromagnetic layer 1B. Materials usable as the nonmagnetic metal layers 1D, 1E are, for example, copper (Cu), gold (Au), silver (Ag), rhenium (Re), osmium (Os), ruthenium (Ru), iridium (Ir), palladium (Pd), chromium (Cr), magnesium (Mg), aluminum (Al), rhodium (Rh) and platinum (Pt). They are preferably thick enough to moderately alleviate the magnetic coupling between the ferromagnetic layers 1A, 1C and the anti-ferromagnetic layer 1B.

More specifically, when the nonmagnetic metal layers 1D, 1E each have a thickness in the range not thinner than 0.1 nm and not thicker than 10 nm, they can moderately relax the exchange coupling between the ferromagnetic layers and the anti-ferromagnetic layer. If the nonmagnetic metal layers 1D, 1E are thicker, they will weaken the exchange coupling. If they are thinner, the function of relaxing the exchanging coupling will be insufficient.

The Inventor experimentally prepared the magnetic multi-layered film 1' according to this specific example and estimated its magnetic properties.

As the ferromagnetic layers 1A, 1C, $Co_{90}Fe_{10}$ or the multi-layered structure $CO_{90}Fe_{10}/NiFe/CO_{90}Fe_{10}$ was used. These two ferromagnetic layers 1A, 1C were equally 1.5 nm thick.

Even when using sputtering, material of the ferromagnetic layers 1A, 1C is not limited to that of the specific example, and iron (Fe), cobalt (Co), nickel (Ni), and their multi-layered films or alloys are also usable.

A layer 1B of iridium manganese (IrMn) as an anti-ferromagnetic material was formed between two ferromagnetic layers 1A, 1C. For the purpose of appropriately controlling the exchanging interaction intensity working between the ferromagnetic layers 1A, 1C, composition of IrMn was adjusted to limit the ratio of Ir outside the range from 22 to 26 atomic %. This is attained by using IrMn containing 15 atomic % of Ir as the sputtering target, for example.

Alternatively, if a sputtering target containing Ir by a ratio in the range from 22 to 26 atomic %, the composition ratio can be offset from that range by simultaneously sputtering a metal target of Ir or manganese (Mn). Alternatively, by adding an element other than iridium and manganese, anti-ferromagnetism of IrMn may be suppressed. As the additive element for this purpose, a nonmagnetic metal element such as copper (Cu) or gold (Au), is preferably used.

Between the ferromagnetic layers 1A, 1C and the anti-ferromagnetic layer 1B, 0.8 nm thick copper (Cu) layers were provided as the nonmagnetic metal layers 1D, 1E. As these metal layers, however, various other nonmagnetic metals such as gold (Au) and silver (Ag) are also usable.

These films made by sputtering underwent fine processing to shape it to be 0.5 μm in width and 1:4 in aspect ratio by using electron beam lithography. However, this specific example of these sizes does not limit the scope of the invention.

With this multi-layered structure, magnetization characteristics were measured.

Figure 8A:
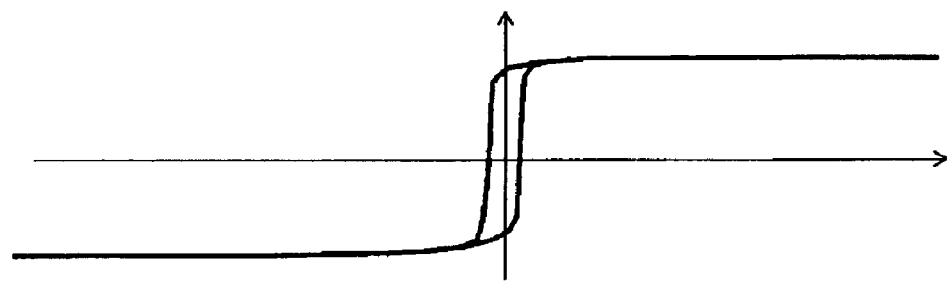
FIG. 8A is a graph diagram showing magnetization and hysteresis of a multi-layered structure according to the second embodiment.

FIG. 8A is a graph diagram showing magnetization and hysteresis of the multi-layered structure according to the second embodiment. The magnetization curve shown here shows magnetization (ordinate) relative to the applied magnetic field (abscissa).

In this specific example, a sputter target of IrMn containing Ir by 22 atomic % was used for fabrication of the anti-ferromagnetic layer 1B. Therefore, if the ferromagnetic layers 1A, 1C are placed adjacent to the anti-ferromagnetic layer 1B, exchange coupling will become excessively intensive.

In this specific example, however, intensity of the exchange coupling can be controlled by inserting nonmagnetic metal layers 1D, 1E. More specifically, the coercive force of 5 Oe and the switching magnetic field of 35 Oe were obtained.

Figure 8B:
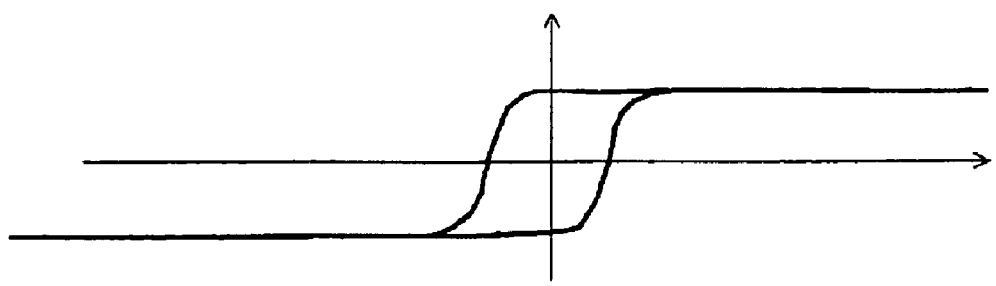
FIG. 8B is a graph diagram showing magnetization and hysteresis in a simplex ferromagnetic layer taken as a comparative example.

FIG. 8B is a graph diagram showing magnetization and hysteresis in a simplex ferromagnetic layer taken as a comparative example. As compared with FIG. 8A, the coercive force gradually increases to above 300 Oe.

That is, in this specific example, by inserting the nonmagnetic metal layers 1D, 1E, it is possible to adequately adjust the exchange coupling between the anti-ferromagnetic layer 1B and the ferromagnetic layers 1A, 1C and thereby reduce the coercive force of the entire magnetic multi-layered films.

Next explained is a result of analysis of the scaling of the switching magnetic field following microminiaturization in regard to the magnetoresistive effect element according to an embodiment of the invention. By fine processing, width of the ferromagnetic layers 1A, 1C was adjusted to 0.2 μm, 0.5 μm, 0.8 μm and 1.2 μm, and their values of coercive force Hc were measured.

Figure 9:
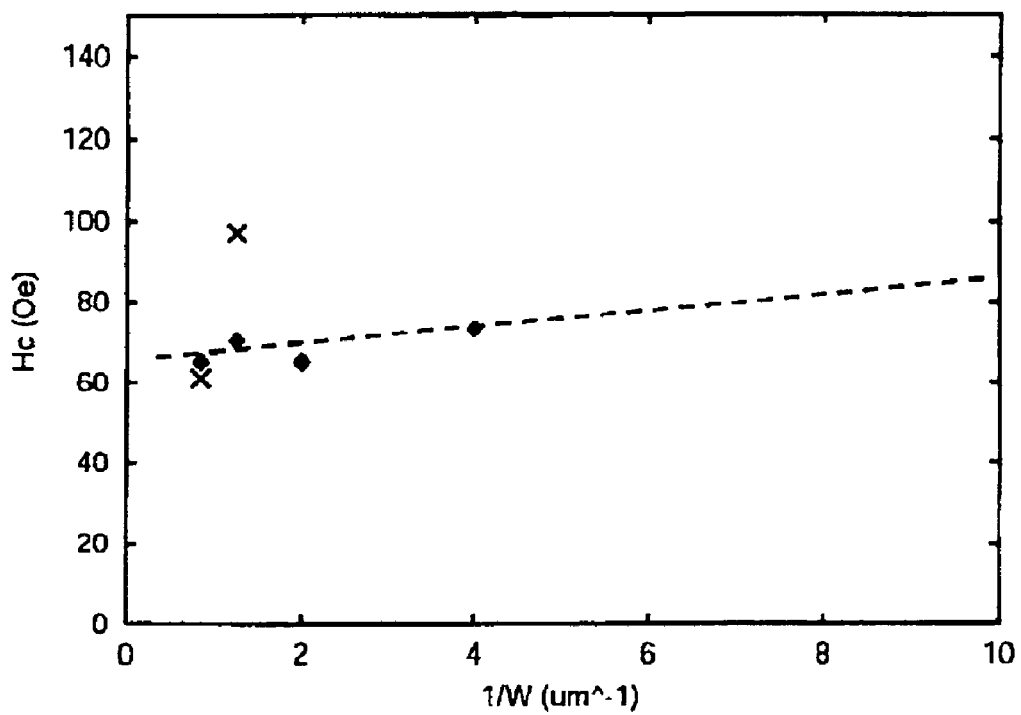
FIG. 9 is a graph diagram plotting values of coercive force in relation to reciprocals of the width of the ferromagnetic layers 1A, 1C.

FIG. 9 is a graph diagram plotting values of coercive force in relation to reciprocals of the width of the ferromagnetic layers 1A, 1C. That is, here are shown changes in coercive force in the magnetoresistive effect element according to the first specific example of the invention by black square dots, together with those of a conventional magnetic simplex film (made of $Co_{90}Fe_{10}$ and 3,0 nm thick) shown by x marks.

It is appreciated from FIG. 9 that coercive force, i.e. switching magnetic field, is smaller in the present invention for all values of the size width.

If the result obtained with the present invention is extended to the width of 0.1 μm, the minimum switching magnetic field as small as approximately 84 oersted (Oe) is obtained when a weak ferromagnetic coupling exists. In contrast, in case a simplex ferromagnetic layer as the prior art is used, the switching magnetic field reaches 100 oersted (Oe) or more when the width is 0.5 μm, and at a still narrower width, the switching magnetic field rapidly increases. Apparently therefore, its practical application is difficult.

Additionally explained is a result of computer simulation to review magnitudes of the magnetic field caused by a current wiring provided in the magnetoresistive effect element. The current wiring has a rectangular section 0.1 μm wide and having the aspect ratio of 1:2, and copper (Cu) or tungsten (W) is used as its material. All around the wiring, or around a part thereof, a shield of a material having a high magnetic permeability such as nickel iron (NiFe) alloy is formed.

If the current of $5.8 \times 10^6$ A/cm$^2$ is supplied to the wiring, magnitude of the magnetic field at a distance of 50 nm from the wiring becomes approximately 90 oersted (Oe). Therefore, even in the case where the ferromagnetic layers 1A, 1C are 0.1 μm wide, magnetic reversal is possible in the magnetoresistive effect element according to the embodiment of the invention. That is, if a magnetic memory element is fabricated by using the magnetoresistive effect element according to the embodiment, magnetic reversal, i.e. "writing", is enabled by the magnetic field generated from the current wiring even when the ferromagnetic layers 1A, 1C are miniaturized to the level around 0.1 μm.

Next explained is a magnetoresistive effect element taken as the third specific example of the invention.

Figure 10:
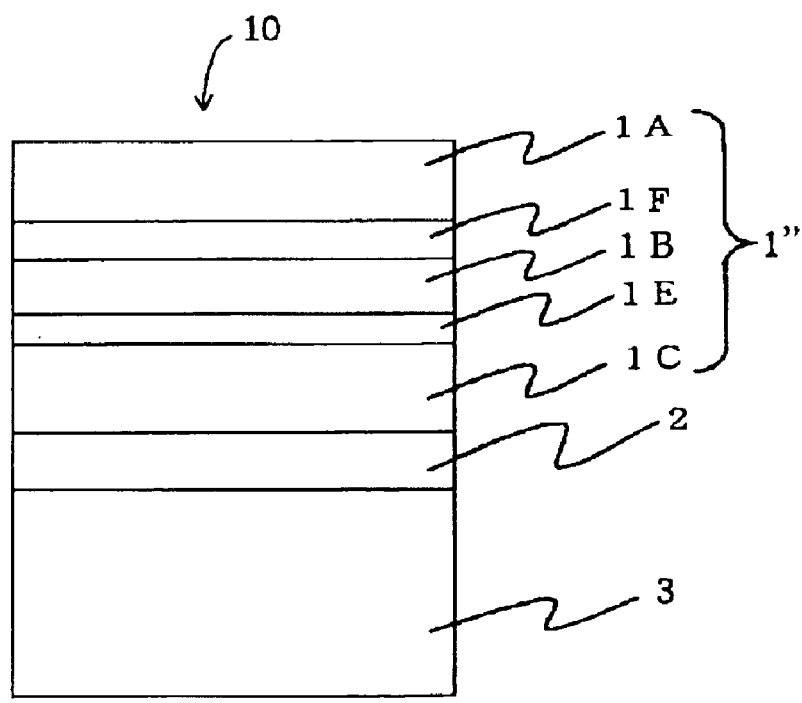
FIG. 10 is a diagram showing a cross-sectional structure of the substantial part of a magnetoresistive effect element taken as the third specific example of the invention.

FIG. 10 is a diagram showing a cross-sectional structure of the substantial part of a magnetoresistive effect element taken as the third specific example of the invention. In FIG. 10, some of components equivalent to those already explained in conjunction with FIGS. 1 through 9 are labeled with common reference numerals, and their detailed explanation is omitted.

Here again, the magnetoresistance element 10 has a ferromagnetic tunnel junction structure in which the insulating film 2 is inserted between the magnetic multi-layered film 1" and the ferromagnetic film 3. A current flows between the magnetic multi-layered film 1" and the ferromagnetic film 3, tunneling through the insulating film 2, and the junction resistance value varies proportionally to the cosine of the relative angle between magnetization directions of the magnetic multi-layered film 1" and the ferromagnetic film 3. As explained in conjunction with the first specific example, the magnetic multi-layered film 1' can be used as a "magnetically free layer" of a magnetic detector element or a "recording layer" of a magnetic memory.

The magnetic multi-layered film 1" in this specific example is different in configuration. That is, the magnetic multi-layered film 1" in this specific example includes dielectric layers 1F, 1G between the ferromagnetic layers 1A, 1C and the anti-ferromagnetic layer 1B, respectively.

The dielectric layers 1F, 1G have the role of moderately relaxing magnetic coupling between the ferromagnetic layers 1A, 1C and the anti-ferromagnetic layer 1B. Materials usable as the dielectric layers 1F, 1G are, for example, oxides or nitrides of various kinds of elements including silicon (Si), aluminum (Al), tantalum (Ta) and others.

The dielectric layers 1F, 1G are preferably thick enough to moderately alleviate the magnetic coupling between the ferromagnetic layers 1A, 1C and the anti-ferromagnetic layer 1B.

More specifically, when the dielectric layers 1F, 1G each have a thickness in the range not thinner than 0.1 nm and not thicker than 10 nm, they can moderately relax the exchange coupling between the ferromagnetic layers and the anti-ferromagnetic layer. If the nonmagnetic metal layers 1D, 1E are thicker, they will weaken the exchange coupling. If they are thinner, the function of relaxing the exchanging coupling will be insufficient.

Insertion of the dielectric layers 1F, 1G ensures the same effect as that of the second specific example. That is, by inserting the dielectric layers 1F, 1G, it is possible to adequately adjust the exchange coupling between the anti-ferromagnetic layer 1B and the ferromagnetic layers 1A, 1C and to reduce the coercive force of the entire magnetic multi-layered film.

Next explained is a magnetoresistive effect element taken as the fourth specific example of the invention.

Figure 11A:
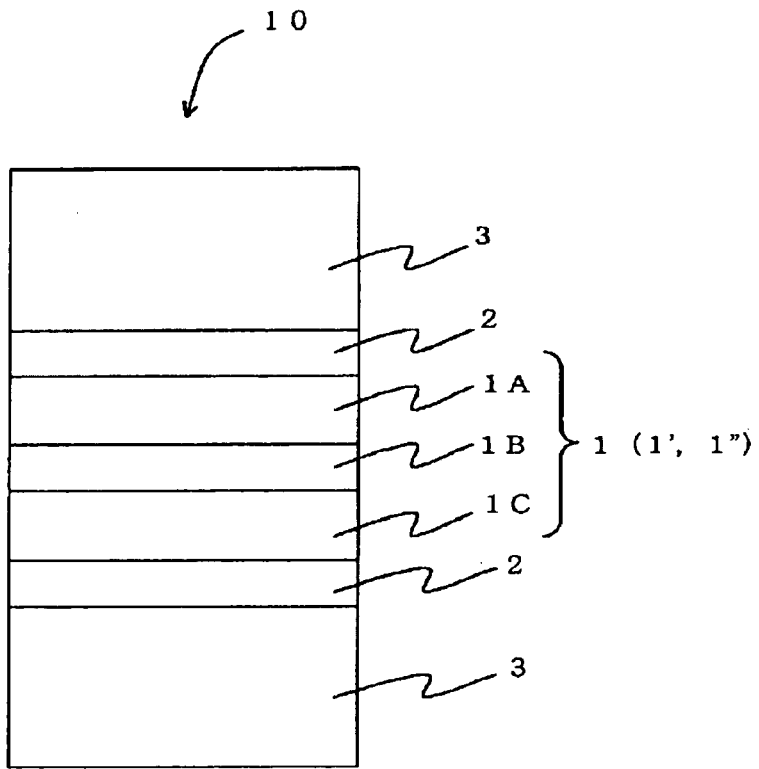
FIG. 11A is a diagram showing a cross-sectional structure of the substantial part of a magnetoresistive effect element taken as the fourth specific example of the invention.

FIG. 11A is a diagram showing a cross-sectional structure of the substantial part of a magnetoresistive effect element taken as the fourth specific example of the invention. In FIG. 11A, some of components equivalent to those already explained in conjunction with FIGS. 1 through 10 are labeled with common reference numerals, and their detailed explanation is omitted.

The magnetoresistive effect element 10 shown here has a so-called "double-junction structure" including two ferromagnetic tunnel junction structures, each of which includes a ferromagnetic film 3 and an intervening insulating film 2, provided at both side of the magnetic multi-layered film 1. In each ferromagnetic tunnel junction structure, a current flows between the magnetic multi-layered film 1 and the ferromagnetic film 3, tunneling through the insulating film 3, and the junction resistance value varies proportionally to the cosine of the relative angle between magnetization directions of the magnetic multi-layered film 1 and the ferromagnetic film 3. As explained in conjunction with the first specific example, the magnetic multi-layered film 1 can be used as a "magnetically free layer" of a magnetic detector element or a "recording layer" of a magnetic memory.

The use of this double-junction structure contributes to increase the output voltage as well as the current variable ratio and enables higher-sensitivity magnetic detection and realization of a memory element excellent in write and read property.

In this fourth specific example, the magnetic multi-layered film 1' already explained in conjunction with FIG. 7 or the magnetic multi-layered film 1" already explained in conjunction with FIG. 10 may be employed instead of the film 1 as well.

Next explained is a magnetoresistive effect element taken as the fifth specific example of the invention.

Figure 11B:
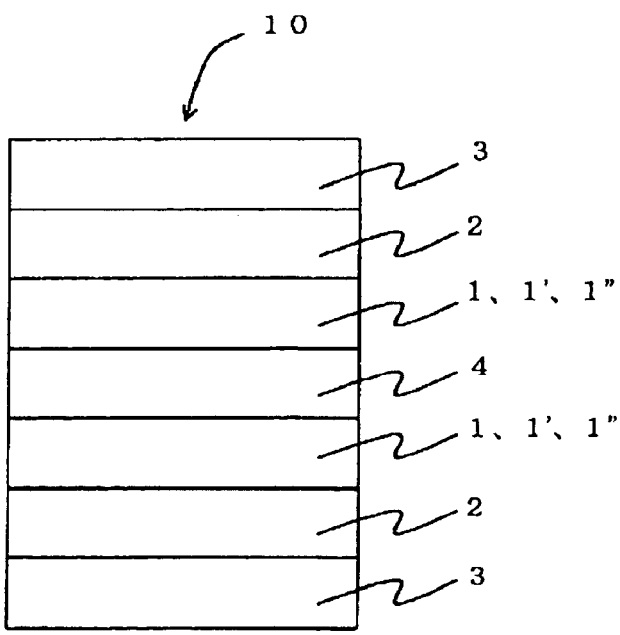
FIG. 11B is a diagram showing a cross-sectional structure of the substantial part of a magnetoresistive effect element taken as the fifth specific example of the invention.

FIG. 11B is a diagram showing a cross-sectional structure of the substantial part of a magnetoresistive effect element taken as the fifth specific example of the invention. In FIG. 11B, some of components equivalent to those already explained in conjunction with FIGS. 1 through 11A are labeled with common reference numerals, and their detailed explanation is omitted.

The magnetoresistive effect element 10 shown here has a so-called "multi-junction structure" including two magnetic multi-layered films 1 (1', 1") and two ferromagnetic films 3. Between each magnetic multi-layered film 1 (1', 1") and each ferromagnetic film 3, a ferromagnetic tunnel junction structure with an intervening insulating film 2 is provided. In each ferromagnetic tunnel junction structure, a current flows between the magnetic multi-layered film 1(1', 1") and the ferromagnetic film 3, tunneling through the insulating film 3, and the junction resistance value varies proportionally to the cosine of the relative angle between magnetization directions of the magnetic multi-layered film 1 (1', 1") and the ferromagnetic film 3. As explained in conjunction with the first specific example, the magnetic multi-layered film 1(1', 1") can be used as a "magnetically free layer" of a magnetic detector element or a "recording layer" of a magnetic memory.

Between those two ferromagnetic tunnel junction structures, an anti-ferromagnetic film 4 is inserted. That is, the antiferromagnetic film 4 is inserted between two magnetic multi-layered films 1(1', 1").

The use of this multi-junction structure contributes to increase the output voltage as well as the current variable ratio and enables higher-sensitivity magnetic detection and realization of a memory element excellent in write and read property.

Additionally, the magnetoresistive effect element according to the invention is not limited to the example of FIG. 11B, but may be modified to other types of multi-junction magnetoresistive effect elements by combining three or more ferromagnetic tunnel junction structures, for example.

Next explained is a specific example that is an application of the magnetoresistive effect element according to an embodiment of the invention to cells of a magnetic random access memory.

In case a magnetoresistive effect element according to any embodiment of the invention is used as a magnetic memory element, because of a sufficiently small switching magnetic field, quick and reliable writing is ensured by using the magnetic memory element as a cell of a large-capacity magnetic random access memory (MRAM).

Figure 12:
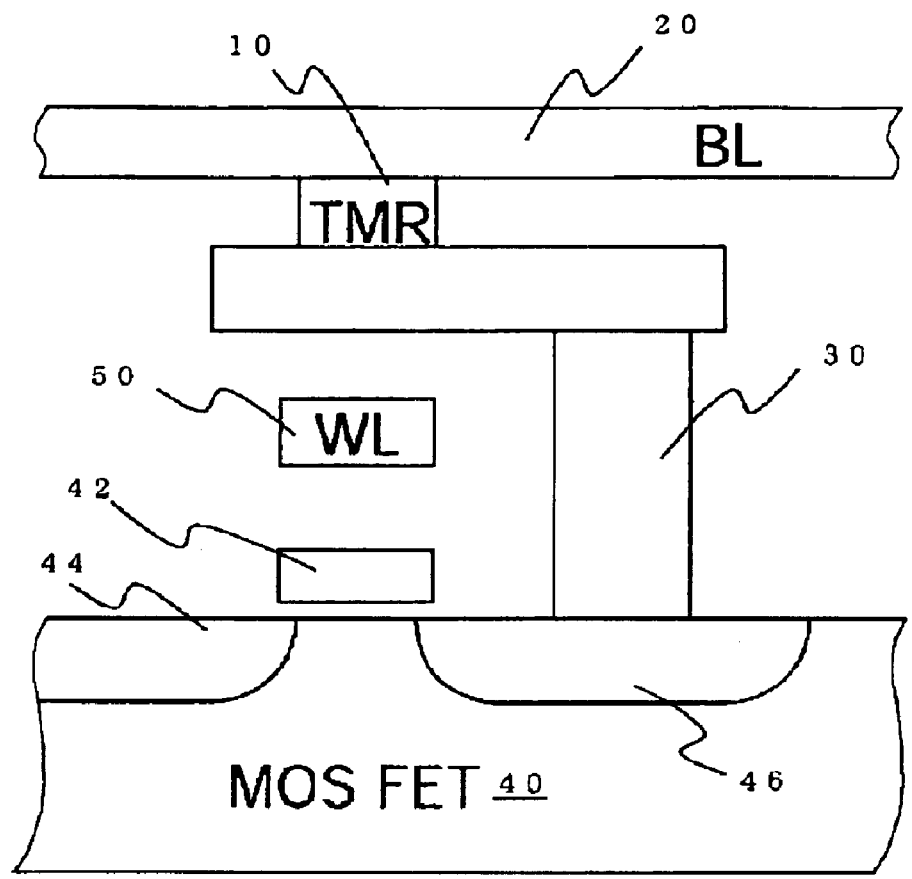
FIG. 12 is a schematic diagram illustrating configuration of the substantial part of a MRAM according to an embodiment of the invention.

FIG. 12 is a schematic diagram illustrating configuration of the substantial part of a MRAM according to an embodiment of the invention.

In MRAM shown here, one end of the magnetoresistive effect element (TMR) 10 according to an embodiment of the invention is connected to a bit line 20, and the other end is connected to a switching element 40 such as MOSFET via a wiring 30. In FIG. 12, the bit line 20 extends substantially in parallel to the sheet plane.

MOSFET 40 includes a source 44 and a drain 46 formed in a semiconductor layer, and can be controlled to turn ON and OFF by a voltage applied to a gate 42.

In addition to them, a writing word line 50 is formed to extend perpendicularly to the bit line 20. In FIG. 12, the word line 50 extends substantially vertically to the sheet plane. The magnetoresistive effect element 10 is positioned near the crossing point of the bit line 20 and the word line 50.

In the magnetoresistive effect element 10, any one of the magnetic multi-layered films 1, 1', 1" already explained in conjunction with FIGS. 1 through 11 functions as the "recording layer", and the ferromagnetic film 3 opposed to the magnetic multi-layered film via the insulating film 2 functions as a "pinned layer". Thus a tunneling current flows through the insulating film.

A number of such cells are integrated in an array to make up a random access memory. The switching element 40 is provided to select desired one of these cells. As the switching element 40, a diode or any other appropriate element having the switching function may be used in lieu of MOSFET. That is, it is also acceptable to stack a diode and the magnetoresistive effect element according to the invention, connect the bit line 20 on the magnetoresistive effect element, and integrate a number of such cells in an array.

Operations of the cell shown in FIG. 12 are explained here. For reading data, MOSFET 40 us turned ON by applying a predetermined voltage to the gate 40, and a sense current is supplied to the magnetoresistive effect element 10 via the bit line 20.

For writing, MOSFET 40 is turned OFF, and a write current is supplied to the bit line 20 and the word line 50 respectively. Then, a magnetic field corresponding to the current is generated in each of them. Thus the total magnetic field obtained at the crossing point of the bit line 20 and the word line 50 inverts the magnetic field in the recording layer in the cell at that position. In this case, by controlling the flowing direction of the current to the bit line 20 and the word line 50 and thereby reversing the magnetic field, one of two values can be stored as information as desired.

As an alternative method for writing, it is also possible to turn ON the MOSFET 40 and supply a write current to the magnetoresistive effect element 10 through the bit line 20. In this case, the word line 50 may be omitted.

With this specific example, the coercive force can be maintained low even when the device size is miniaturized, by using appropriate one of magnetic multi-layered films 1, 1', 1" explained with reference to FIGS. 1 through 11 as the recording layer. That is, the specific example ensures the effect of facilitating writing in the "recording layer".

That is, the embodiment of the invention enables reliable, easy writing even with more miniaturized elements, and can thereby realize an integrated-type magnetic memory by a much higher density than conventional ones.

Figure 13:
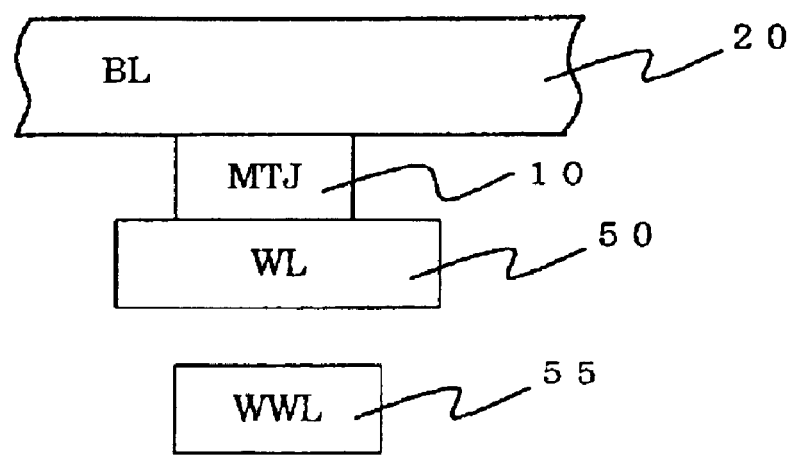
FIG. 13 is a cross-sectional view showing another specific example of MRAM cell according to an embodiment of the invention.

FIG. 13 is a cross-sectional view showing another specific example of MRAM cell according to an embodiment of the invention;

MRAM shown here has a structure using no switching transistor in the memory cell.

One end of the magnetoresistive (TMR) element 10 according to the embodiment of the invention is connected to the bit line 20, and the other end thereof is connected to the word line 50. The bit line 20 and the word line 50 extend to intersect with each other substantially at a right angle. That is, in FIG. 13, the bit line 20 extends substantially in parallel to the sheet plane, and the word line 50 extends substantially vertically to the sheet plane. The magnetoresistive effect element 10 is positioned near the crossing point of the bit line 20 and the word line 50.

In the magnetoresistive effect element 10, any one of the magnetic multi-layered films 1, 1', 1" already explained in conjunction with FIGS. 1 through 11 functions as the "recording layer", and the ferromagnetic film 3 opposed to the magnetic multi-layered film via the insulating film 2 functions as a "pinned layer". Thus a tunneling current flows through the insulating film. A number of such cells are integrated in an array to make up a random access memory.

Operations of the cell shown in FIG. 13 are explained here. First in reading operation, by selecting a predetermined bit line 20 and a predetermined word line 50, and supplying a sense current to the magnetoresistive effect element 10 connected to their crossing point, data can be read.

In writing operation, a write current is supplied to a predetermined bit line 20 and a writing word line 55. As a result, a magnetic field corresponding to the current is generated in each of them. Thus the total magnetic field obtained at the crossing point of the bit line 20 and the writing word line 55 inverts the magnetic field in the recording layer in the cell at that position. In this case, by controlling the flowing direction of the current to the bit line 20 and the writing word line 55 and thereby reversing the magnetic field, one of two values can be stored as information as desired.

Also with this specific example, the coercive force can be maintained low even when the device size is miniaturized, by using appropriate one of magnetic multi-layered films 1, 1', 1" explained with reference to FIGS. 1 through 11 as the recording layer. That is, the specific example ensures the effect of facilitating writing in the "recording layer".

Besides, as this specific example does not require any switching transistor, it becomes quite easy to stack the memory cells in the vertical direction. By employing such a stacked configuration, a magnetic memory with a much larger capacity can be easily realized without increasing a chip size.

Next explained is an embodiment that is an application of the magnetoresistive effect element according to an embodiment of the invention to a magnetic head.

Figure 14:
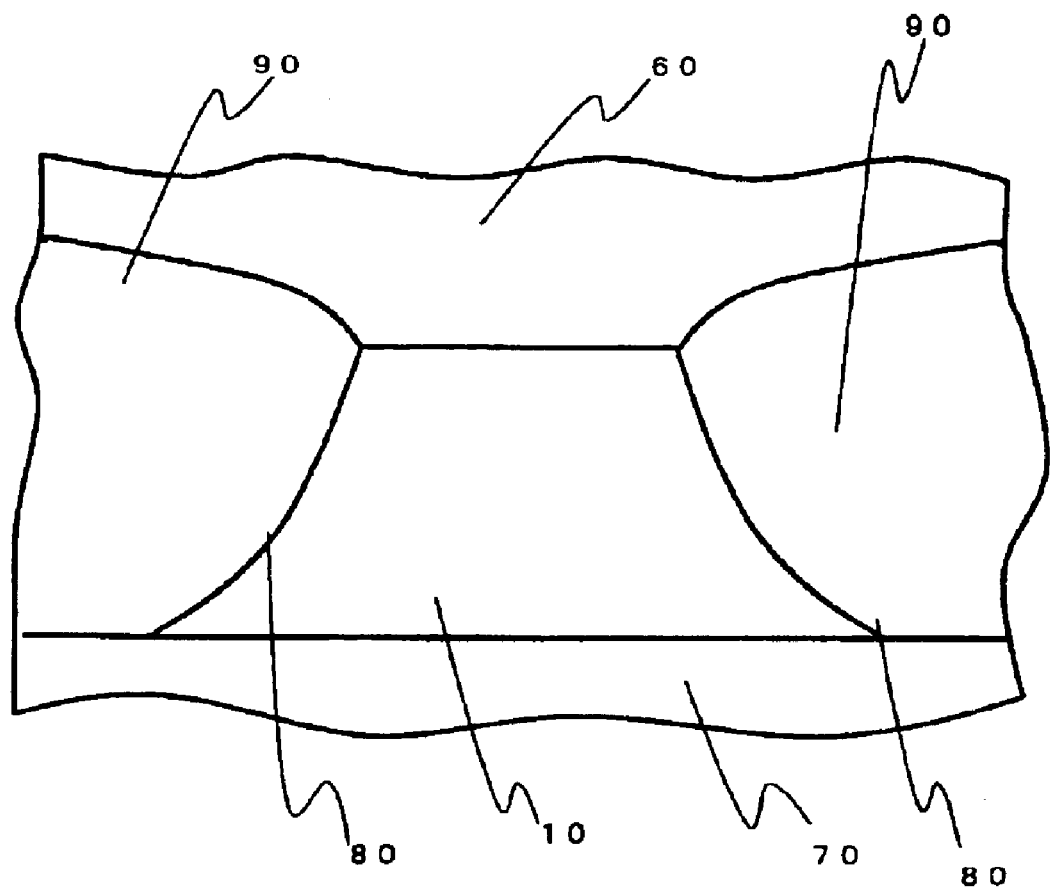
FIG. 14 is a diagram schematically showing configuration of the substantial part of a magnetic head according to an embodiment of the invention.
Figure 15:
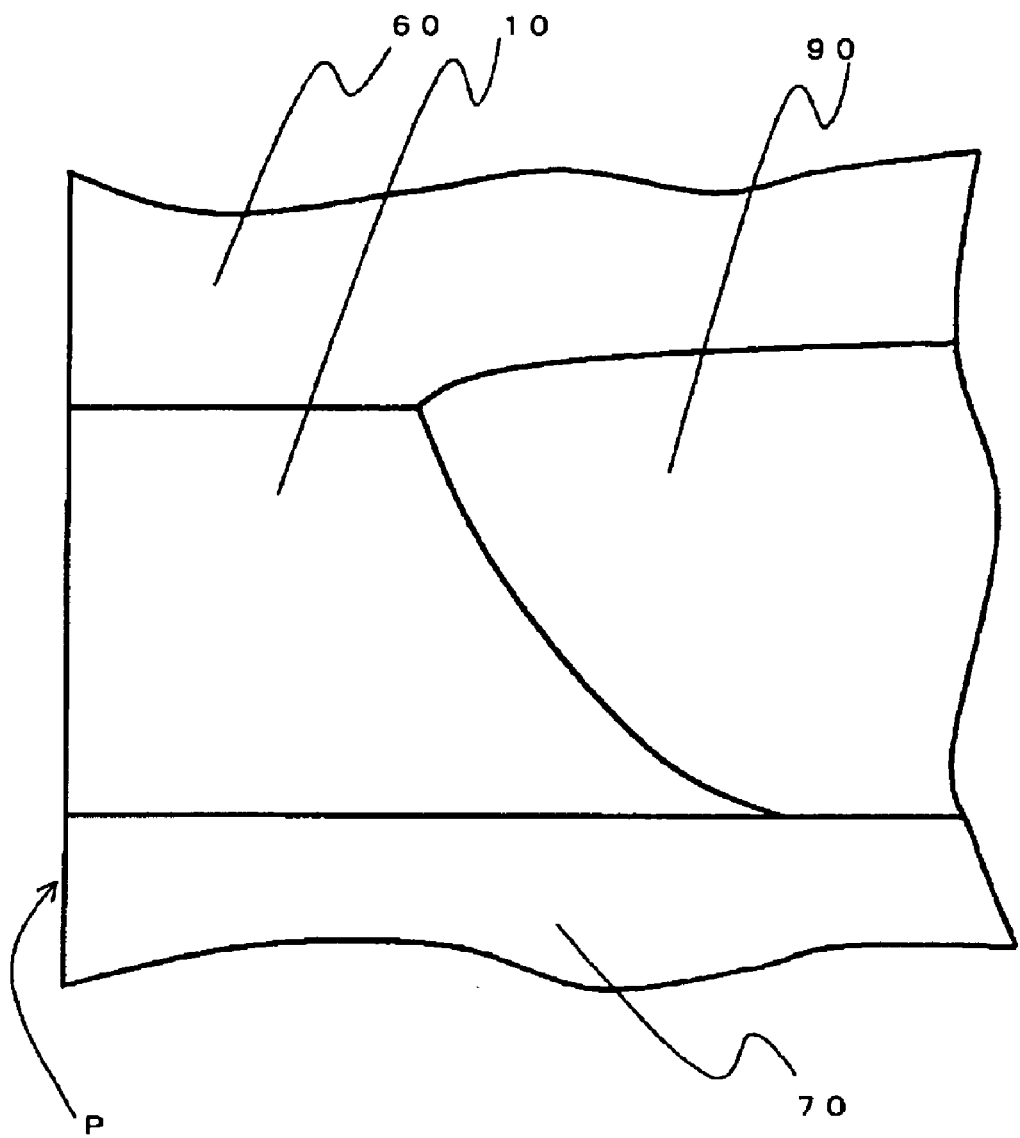
FIG. 15 is a diagram schematically showing configuration of the substantial part of a magnetic head according to an embodiment of the invention.

FIGS. 14 and 15 are diagrams schematically showing configuration of the substantial part of a magnetic head according to an embodiment of the invention. FIG. 14 is a cross-sectional view of the magnetoresistance element, taken along a plane substantially in parallel to the medium-facing plane P opposed to a magnetic recording medium (not shown). FIG. 15 is a cross-sectional view of the magnetoresistance element, taken along a plane vertical to the medium-facing plane P.

A lower electrode 70 and an upper electrode 60 are provided on and under the magnetoresistive effect element 10 according to the embodiment already explained with reference to FIGS. 1 through 9, and in insulating film 90 is formed on opposite side surfaces of the magnetoresistive effect element 10 in FIG. 14. Additionally, as shown in FIG. 2, the insulating film 90 is formed on the back surface of the magnetoresistive effect element 10 as well.

A sense current to the magnetoresistive effect element 10 is supplied vertically to the film plane of the multi-layered film by the overlying and underlying electrodes 60, 70.

According to this embodiment of the invention, the use of the magnetic multi-layered film 1, 1' as the magnetically free layer of the magnetoresistance element 10 contributes to suppress reversal magnetization even in microminiaturized elements. Therefore, even with an ultrahigh-density magnetic recording system using microminiaturized magnetoresistive effect elements, highly sensitive magnetic reproduction is possible.

Next explained is a magnetic recording/reproducing apparatus according to the invention. The magnetic head using the magnetoresistive effect element according to the invention, as explained with reference to FIGS. 1 through 15, can be incorporated in a magnetic head assembly of a recording/reproducing integral type, for example, and can be mounted in a magnetic reproducing apparatus.

Figure 16:
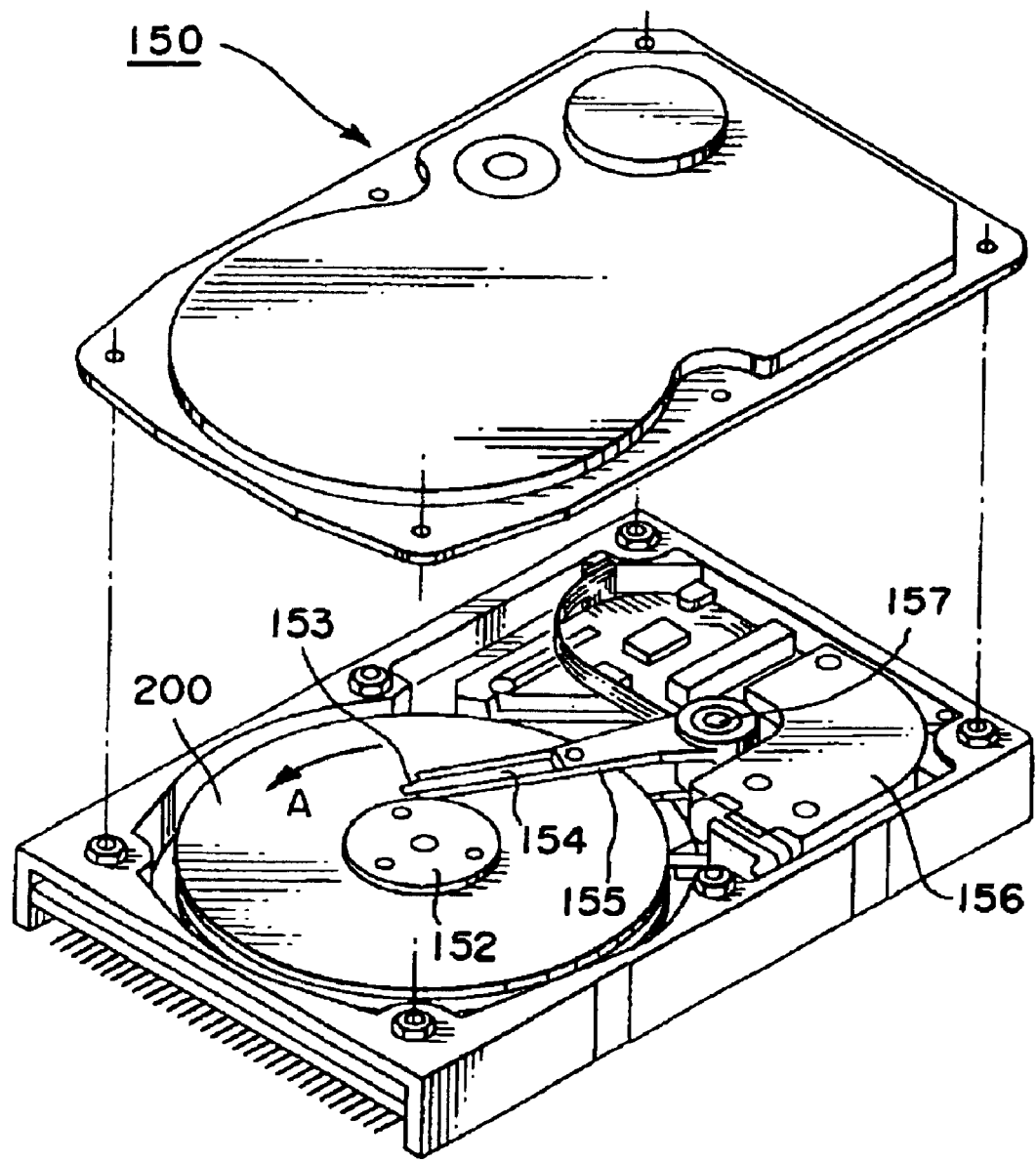
FIG. 16 is a perspective view of general configuration of the substantial part of a magnetic record/reproduce apparatus using a magnetoresistive effect element according to an embodiment of the invention.

FIG. 16 is a perspective view that schematically shows a configuration of a major part of a magnetic recording/reproducing apparatus according to the embodiment of the invention. The magnetic recording/reproducing apparatus 150 according to the invention is an apparatus of a type using a rotary actuator. In FIG. 16, a recording magnetic disk 200 is mounted on a spindle 152 and rotated in the arrow A direction by a motor, not shown, which is responsive to a control signal from a drive device controller, not shown. The magnetic recording apparatus according to the embodiment of the invention may also include a plurality of recording magnetic disks 200.

A head slider 153 executed recording or reproduction of information to be stored in the magnetic disk 200 is attached to the tip of a thin-film suspension 154. The head slider 153 includes the magnetic head according to the foregoing embodiment near its tip.

When the magnetic disk 200 rotates, the medium-facing surface (ABS) of the head slider 153 is held with a predetermined floating amount from the surface of the magnetic disk 200. Alternatively, the apparatus may employ a contact-type configuration where the slider 153 is in contact with the disk 200 during the operation The suspension 154 is connected to one end of an actuator arm 155 that has a bobbin portion for holding a drive coil, not shown. At the other end of the actuator arm 155, a voice coil motor 156, which is a kind of linear motor, is provided. The voice coil motor 156 is composed of a drive coil, not shown, wound up on the bobbin portion of the actuator arm 155, and a magnetic circuit made up of a permanent magnet and an opposed yoke disposed in confrontation so as to sandwich the drive coil.

The actuator arm 155 is held by ball bearings, not shown, which are provided upper and lower two positions of a rigid shaft 157 for free rotational and slidable movements with a driving force from the voice coil motor 156.

Figure 17:
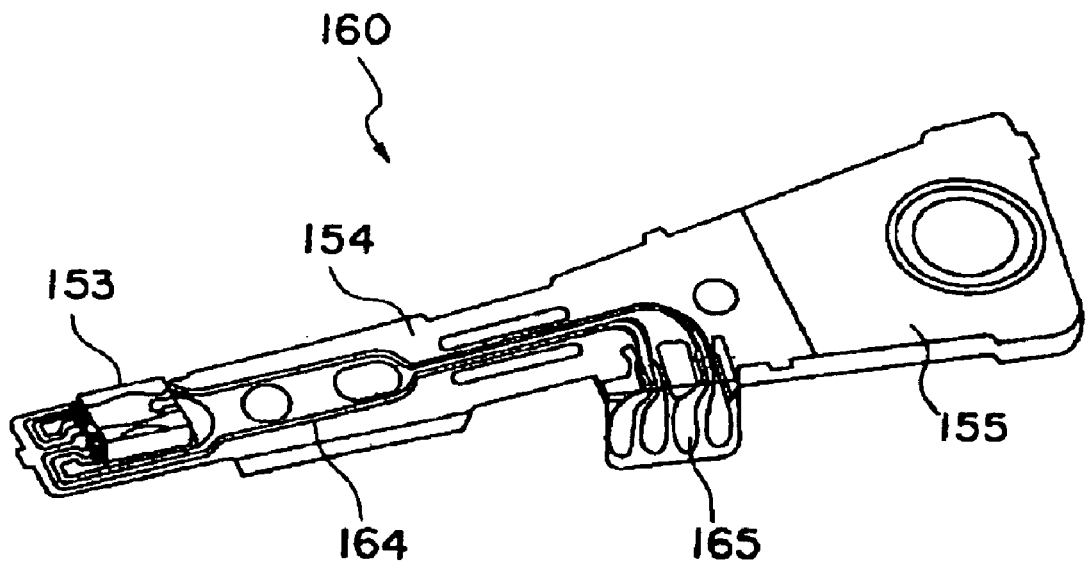
FIG. 17 is an enlarged, perspective view of a distal end from an actuator arm 155 of a magnetic head assembly, viewed from the disk side.

FIG. 17 is an enlarged, perspective view of the magnetic head assembly from the actuator arm 155 to its distal end, taken from the disk side. The magnetic head assembly 160 includes the actuator arm 155 having the bobbin portion for holding the drive coil, for example, and the suspension 154 is connected to one end of the actuator arm 155.

At the extremity of the suspension 154, the head slider 153 incorporating the reproducing magnetic head which includes a magnetoresistive effect element according to the invention is attached. A recording head may be combined with it. The suspension 154 has a lead line 164 for writing and reading signals, and the lead line 164 and electrodes of the magnetic head incorporated in the head slider 153 are electrically connected. Numeral 165 denotes an electrode pad of the magnetic head assembly 160.

The magnetic recording/reproducing apparatus according to the invention, as shown in FIGS. 16 and 17, can greatly improve the recording density as compared with conventional systems, and can simultaneously improve the stability and reliability of reproduced signals.

Heretofore, embodiments of the invention have been explained in detail with reference to some specific examples. The invention, however, is not limited to these specific examples.

For example, material, shape and thickness of the ferromagnetic layer, anti-ferromagnetic layer, insulating film and ferromagnetic film of the magnetoresistive effect element according to the invention may be appropriately selected by those skilled in the art within the known techniques to carry out the invention as taught in the specification and obtain equivalent effects.

Further, also concerning the magnetic memory and the magnetic head according to the invention, those skilled in the art will be able to carry out the invention by appropriately selecting a material or a structure within the known techniques.

It will be also appreciated that the invention is applicable not only to magnetic heads or magnetic reproducing apparatuses of the lengthwise recording type but also to those of the perpendicular magnetic recording type and ensures substantially the same effects.

The magnetic reproducing apparatus according to the embodiment of the invention may be of a so-called stationary type incorporating a particular recording medium in a stationary fashion, or of a so-called "removable" type permitting recording mediums to be loaded and unloaded.

As explained above, embodiments of the invention can provide magnetoresistive effect elements low in coercive force and therefore small in switching magnetic field.

That is, according to embodiments of the invention, it is possible to provide a tunnel junction magnetoresistive effect element including a magnetic multi-layered film, ferromagnetic film and intervening insulating film such that a current flows between the magnetic multi-layered film and the ferromagnetic film, tunneling through the insulating film, in which the magnetic multi-layered film includes a first ferromagnetic layer, second ferromagnetic layer and anti-ferromagnetic layer inserted between the first and second ferromagnetic layers. In the magnetoresistive effect element having such configuration, the coercive force is small, and the switching magnetic field is small accordingly.

Further, when the magnetoresistive effect element according to the embodiment is shaped to be wider in end portions than in the central portion, "edge domains" in the end portions can be stabilized, and it contributes to a more decrease of the switching magnetic field.

On the other hand, in case the magnetoresistive effect element is used as a memory cell of a magnetic memory, the wrote current supplied for generating a magnetic field necessary for magnetic reversal may be smaller. Therefore, the magnetic memory using the elements according to the invention as its memory cells consumes less power and can be densely integrated. Additionally, it is enhanced in switching speed as well.

In case the magnetoresistive effect element according to an embodiment of the invention is used as a magnetic detector element for reproduction in a magnetic recording system, high reproducing sensitivity is ensured even when the detector element is miniaturized in accordance with the requirement of higher recording densities, and a magnetic recording system having ultrahigh recording density can be realized.

As such, the invention greatly contributes to realization of a high-integrated magnetic memory using magnetoresistive effect elements and an ultrahigh-density magnetic recording system, which must be a great industrial advantage.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistive effect element comprising:
   a first magnetic multi-layered film including a first ferromagnetic layer, a second ferromagnetic layer, and a first anti-ferromagnetic layer interposed between said first and second ferromagnetic layers;
   a first ferromagnetic film; and
   a first insulating film interposed between said first magnetic multi-layered film and said first ferromagnetic film,
   wherein a current flows between said first magnetic multi-layered film and said first ferromagnetic film by tunneling through said first insulating film,
   magnitude of exchange coupling which acts between said first ferromagnetic layer and said first anti-ferromagnetic layer is limited not to exceed 1000 oersted, and
   magnitude of exchange coupling which acts between said second ferromagnetic layer and said first anti-ferromagnetic layer is limited not to exceed 1000 oersted.

2. A magnetoresistive effect element according to claim 1, wherein said first ferromagnetic film is fixed is magnetization orientation, and magnetization orientation of the entirety of said first magnetic multi-layered film is variable.

3. A magnetoresistive effect element according to claim 1, wherein magnetization orientation of said first ferromagnetic film and magnetization orientation of the entirety of said first magnetic multi-layered film is parallel or anti-parallel.

4. A magnetoresistive effect element comprising:
   a first magnetic multi-layered film including a first ferromagnetic layer, a second ferromagnetic layer, a first anti-ferromagnetic layer interposed between said first and second ferromagnetic layers, a first nonmagnetic metal layer interposed between said first ferromagnetic layer and said first anti-ferromagnetic layer, and a second nonmagnetic metal layer interposed between said second ferromagnetic layer and said first anti-ferromagnetic layer;
   a first ferromagnetic film; and
   a first insulating film interposed between said first magnetic multi-layered film and said first ferromagnetic film,
   wherein a current flows between said first magnetic multi-layered film and said first ferromagnetic film by tunneling through said first insulating film.

5. A magnetoresistive effect element according to claim 4, wherein thicknesses of said first and second nonmagnetic metal layers are in the range not thinner than 0.1 nm and not thicker than 10 nm.

6. A magnetoresistive effect element according to claim 4, wherein magnitude of exchange coupling which acts between said first ferromagnetic layer and said first anti-ferromagnetic layer is limited not to exceed 1000 oersted, and
   magnitude of exchange coupling which acts between said second ferromagnetic layer and said first anti-ferromagnetic layer is limited not to exceed 1000 oersted.

7. A magnetoresistive effect element according to claim 4,
   wherein said first anti-ferromagnetic layer is made of an alloy selected from the group consisting of iridium manganese (IrMn), platinum manganese (PtMn), iron manganese (FeMn), ruthenium manganese (RuMn), nickel manganese (NiMn), and palladium platinum manganese (PdPtMn), and
   thickness of said first anti-ferromagnetic layer is in the range not thinner than 0.1 nm and not thicker than 50 nm.

8. A magnetoresistive effect element according to claim 4, which is shaped to be wider in end portions than in a central portion.

9. A magnetoresistive effect element according to claim 4, wherein said first ferromagnetic film is fixed in magnetization orientation, and magnetization orientation of the entirety of said first magnetic multi-layered film is variable.

10. A magnetoresistive effect element according to claim 4,
    wherein magnetization orientation of said first ferromagnetic film and magnetization orientation of the entirety of said first magnetic multi-layered film is parallel or anti-parallel.

11. A magnetoresistive effect element comprising:
    a first magnetic multi-layered film including a first ferromagnetic layer, a second ferromagnetic layer, a first anti-ferromagnetic layer interposed between said first and second ferromagnetic layers, a first dielectric layer interposed between said first ferromagnetic layer and said first anti-ferromagnetic layer, and a second dielectric layer interposed between said second ferromagnetic layer and said first anti-ferromagnetic layer;
    a first ferromagnetic film; and
    a first insulating film interposed between said first magnetic multi-layered film and said first ferromagnetic film,
    wherein a current flows between said first magnetic multi-layered film and said first ferromagnetic film by tunneling through said first insulating film.

12. A magnetoresistive effect element according to claim 11,
    wherein thicknesses of said first and second dielectric layers are in the range not thinner than 0.1 nm and not thicker than 10 nm.

13. A magnetoresistive effect element according to claim 11,
    wherein magnitude of exchange coupling which acts between said first ferromagnetic layer and said first anti-ferromagnetic layer is limited not to exceed 1000 oersted, and
    magnitude of exchange coupling which acts between said second ferromagnetic layer and said first anti-ferromagnetic layer is limited not to exceed 1000 oersted.

14. A magnetoresistive effect element according to claim 11,
    wherein said first anti-ferromagnetic layer is made of an alloy selected from the group consisting of iridium manganese (IrMn), platinum manganese (PtMn), iron manganese (FeMn), ruthenium manganese (RuMn), nickel manganese (NiMn), and palladium platinum manganese (PdPtMn), and
    thickness of said first anti-ferromagnetic layer is in the range not thinner than 0.1 nm and not thicker than 50 nm.

15. A magnetoresistive effect element according to claim 11, which is shaped to be wider in end portions than in a central portion.

16. A magnetoresistive effect element according to claim 11,
wherein said first ferromagnetic film is fixed in magnetization orientation, and magnetization orientation of the entirety of said first magnetic multi-layered film is variable.

17. A magnetoresistive effect element according to claim 11,
wherein magnetization orientation of said first ferromagnetic film and magnetization orientation of the entirety of said first magnetic multi-layered film is parallel or anti parallel.

18. A magnetoresistive effect element comprising:
a first magnetic multi-layered film including a first ferromagnetic layer, a second ferromagnetic layer, and a first anti-ferromagnetic layer interposed between said first and second ferromagnetic layers;
a first ferromagnetic film;
a first insulating film interposed between said first magnetic multi-layered film and said first ferromagnetic film;
a second magnetic multi-layered film including a third ferromagnetic layer, a fourth ferromagnetic layer, and a second anti-ferromagnetic layer interposed between said third and fourth ferromagnetic layers;
a second ferromagnetic film; and
a second insulating film interposed between said second magnetic multi-layered film and said second ferromagnetic film,
wherein a current flows through said first and second magnetic multi-layered films and said first and second ferromagnetic films by tunneling through said first and second insulating films.

19. A magnetoresistive effect element according to claim 18,
wherein magnitude of exchange coupling which acts between said first ferromagnetic layer and said first anti-ferromagnetic layer is limited not to exceed 1000 oersted,
magnitude of exchange coupling which acts between said second ferromagnetic layer and said first anti-ferromagnetic layer is limited not to exceed 1000 oersted,
magnitude of exchange coupling which acts between said third ferromagnetic layer and said second anti-ferromagnetic layer is limited not to exceed 1000 oersted, and
magnitude of exchange coupling which acts between said fourth ferromagnetic layer and said second anti-ferromagnetic layer is limited not to exceed 1000 oersted.

20. A magnetoresistive effect element according to claim 18,
wherein said first and second anti-ferromagnetic layers are made of an alloy selected from the group consisting of iridium manganese (IrMn), platinum manganese (PtMn), iron manganese (FeMn), ruthenium manganese (RuMn), nickel manganese (NiMn), and palladium platinum manganese (PdPtMn), and
thicknesses of said first and second anti-ferromagnetic layers are in the range not thinner than 0.1 nm and not thicker than 50 nm.

21. A magnetoresistive effect element according to claim 18,
wherein said first ferromagnetic film is fixed in magnetization orientation, said second ferromagnetic film is fixed in magnetization orientation, magnetization orientation of the entirety of said first magnetic multi-layered film is variable, and magnetization orientation of the entirety of said second magnetic multi-layered film is variable.

22. A magnetoresistive effect element according to claim 18,
wherein magnetization orientation of said first ferromagnetic film and magnetization orientation of the entirety of said first magnetic multi-layered film is parallel or anti parallel, and magnetization orientation of said second ferromagnetic film and magnetization orientation of the entirety of said second magnetic multi-layered film is parallel or anti-parallel.

23. A magnetic memory comprising a magnetoresistive effect element, said magnetoresistive effect element including:
a first magnetic multi-layered film including a first ferromagnetic layer, a second ferromagnetic layer, and a first anti-ferromagnetic layer interposed between said first and second ferromagnetic layers;
a first ferromagnetic film; and
a first insulating film interposed between said first magnetic multi-layered film and said first ferromagnetic film, wherein
a current flows between said first magnetic multi-layered film and said first ferromagnetic film by tunneling through said first insulating film,
said first ferromagnetic film of said magnetoresistive effect element is fixed in magnetization orientation,
magnetization orientation of the entirety of said first magnetic multi-layered film is able to be re-written,
magnitude of exchange coupling which acts between said first ferromagnetic layer and said first anti-ferromagnetic layer is limited not to exceed 1000 oersted, and
magnitude of exchange coupling which acts between said second ferromagnetic layer and said first anti-ferromagnetic layer is limited not to exceed 1000 oersted.

24. A magnetic memory comprising a magnetoresistive effect element, said magnetoresistive effect element including:
a first magnetic multi-layered film including a first ferromagnetic layer, a second ferromagnetic layer, a first anti ferromagnetic layer interposed between said first and second ferromagnetic layers, a first nonmagnetic metal layer interposed between said first ferromagnetic layer and said first anti-ferromagnetic layer, and a second nonmagnetic metal layer interposed between said second ferromagnetic layer and said first anti ferromagnetic layer;
a first ferromagnetic film; and
a first insulating film interposed between said first magnetic multi-layered film and said first ferromagnetic film, wherein
a current flows between said first magnetic multi-layered film and said first ferromagnetic film by tunneling through said first insulating film,
said first ferromagnetic film of said magnetoresistive effect element is fixed in magnetization orientation, and magnetization orientation of the entirety of said first magnetic multi-layered is able to be re-written.

25. A magnetic memory comprising a magnetoresistive effect element, said magnetoresistive effect element including:

a first magnetic multi-layered film including a first ferromagnetic layer, a second ferromagnetic layer, a first anti-ferromagnetic layer interposed between said first and second ferromagnetic layers, a first dielectric layer interposed between said first ferromagnetic layer and said first anti-ferromagnetic layer, and a second dielectric layer interposed between said second ferromagnetic layer and said first anti-ferromagnetic layer;

a first ferromagnetic film; and a first insulating film interposed between said first magnetic multi-layered film and said first ferromagnetic film, wherein a current flows between said first magnetic multi-layered film and said first ferromagnetic film by tunneling through said first insulating film, said first ferromagnetic film of said magnetoresistive effect element is fixed in magnetization orientation, and magnetization orientation of the entirety of said first magnetic multi-layered film is able to be re-written.

26. A magnetic memory comprising a magnetoresistive effect element and a writing current wiring, said magnetoresistive effect element including:

a first magnetic multi-layered film including a first ferromagnetic layer, a second ferromagnetic layer, and a first anti-ferromagnetic layer interposed between said first and second ferromagnetic layers;

a first ferromagnetic film; and a first insulating film interposed between said first magnetic multi-layered film and said first ferromagnetic film, wherein a current flow between said first magnetic multi-layered film and said first ferromagnetic film by tunneling through said first insulating film, said first ferromagnetic film of said magnetoresistive effect element is fixed in magnetization orientation, magnetization orientation of the entirety of said first magnetic multi-layered film is able to be re-written by a magnetic field generated by a current supplied to said writing current wiring, magnitude of exchange coupling which acts between said first ferromagnetic layer and said first anti-ferromagnetic layer is limited not to exceed 1000 oersted, and magnitude of exchange coupling which acts between said second ferromagnetic layer and said first anti-ferromagnetic layer is limited not to exceed 1000 oersted.

27. A magnetic memory comprising a magnetoresistive effect element and a writing current wiring, said magnetoresistive effect element including:

a first magnetic multi-layered film including a first ferromagnetic layer, a second ferromagnetic layer, a first anti-ferromagnetic layer interposed between said first and second ferromagnetic layers, a first nonmagnetic metal layer interposed between said first ferromagnetic layer and said first anti-ferromagnetic layer, and a second nonmagnetic metal layer interposed between said second ferromagnetic layer and said first anti-ferromagnetic layer;

a first ferromagnetic film; and a first insulating film interposed between said first magnetic multi-layered film and said first ferromagnetic film, wherein a current flows between said first magnetic multi-layered film and said first ferromagnetic film by tunneling through said first insulating film, said first ferromagnetic film of said magnetoresistive effect element is fixed in magnetization orientation, and magnetization orientation of the entirety of said first magnetic multi-layered film is able to be re-written by a magnetic field generated by a current supplied to said writing current wiring.

28. A magnetic memory comprising a magnetoresistive effect element and a writing current wiring, said magnetoresistive effect element including:

a first magnetic multi-layered film including a first ferromagnetic layer, a second ferromagnetic layer, a first anti-ferromagnetic layer interposed between said first and second ferromagnetic layers, a first dielectric layer interposed between said first ferromagnetic layer and said first anti-ferromagnetic layer, and a second dielectric layer interposed between said second ferromagnetic layer and said first anti-ferromagnetic layer;

a first ferromagnetic film, and a first insulating film interposed between said first magnetic multi-layered film and said first ferromagnetic film, wherein a current flows between said first magnetic multi-layered film and said first ferromagnetic film by tunneling through said first insulating film, said first ferromagnetic film of said magnetoresistive effect element is fixed in magnetization orientation, and magnetization orientation of the entirety of said first magnetic multi-layered film is able to be re-written by a magnetic field generated by a current supplied to said writing current wiring.

29. A magnetic head comprising a magnetoresistive effect element, said magnetoresistive effect element including:

a first magnetic multi-layered film including a first ferromagnetic layer, a second ferromagnetic layer, and a first anti-ferromagnetic layer interposed between said first and second ferromagnetic layers;

a first ferromagnetic film; and a first insulating film interposed between said first magnetic multi-layered film and said first ferromagnetic film, wherein a current flows between said first magnetic multi-layered film and said first ferromagnetic film by tunneling through said first insulating film, magnitude of exchange coupling which acts between said first ferromagnetic layer and said first anti-ferromagnetic layer is limited not to exceed 1000 oersted, and magnitude of exchange coupling which acts between said second ferromagnetic layer and said first anti-ferromagnetic layer is limited not to exceed 1000 oersted.

30. A magnetic head comprising a magnetoresistive effect element, said magnetoresistive effect element including:

a first magnetic multi-layered film including a first ferromagnetic layer, a second ferromagnetic layer, a first anti-ferromagnetic layer interposed between said first and second ferromagnetic layers, a first nonmagnetic metal layer interposed between said first ferromagnetic layer and said first anti-ferromagnetic layer, and a second nonmagnetic metal layer interposed between said second ferromagnetic layer and said first anti-ferromagnetic layer;

a first ferromagnetic film; and a first insulating film interposed between said first magnetic multi-layered film and said first ferromagnetic film, wherein a current flows between said first magnetic multi-layered film and said first ferromagnetic film by tunneling through said first insulating film.

31. A magnetic head comprising a magnetoresistive effect element, said magnetoresistive effect element including:

a first magnetic multi-layered film including a first ferromagnetic layer, a second ferromagnetic layer, a first anti-ferromagnetic layer interposed between said first and second ferromagnetic layers, a first dielectric layer interposed between said first ferromagnetic layer and said first anti-ferromagnetic layer, and a second dielectric layer interposed between said second ferromagnetic layer and said first anti-ferromagnetic layer;

a first ferromagnetic film; and a first insulating film interposed between said first magnetic multi-layered film and said first ferromagnetic film, wherein a current flows between said first magnetic multi-layered film and said first ferromagnetic film by tunneling through said first insulating film.

* * * * *